US012300471B2

(12) United States Patent
Senda

(10) Patent No.: US 12,300,471 B2
(45) Date of Patent: May 13, 2025

(54) STAGE, PLASMA PROCESSING APPARATUS, AND CLEANING METHOD

(71) Applicant: Tokyo Electron Limited, Tokyo (JP)

(72) Inventor: Takahiro Senda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 98 days.

(21) Appl. No.: 17/166,132

(22) Filed: Feb. 3, 2021

(65) Prior Publication Data

US 2021/0249236 A1 Aug. 12, 2021

(30) Foreign Application Priority Data

Feb. 10, 2020 (JP) ................................. 2020-020840

(51) Int. Cl.
*H01J 37/32* (2006.01)
*H01L 21/67* (2006.01)
*H01L 21/683* (2006.01)

(52) U.S. Cl.
CPC .. *H01J 37/32715* (2013.01); *H01J 37/32862* (2013.01); *H01L 21/67069* (2013.01); *H01L 21/6833* (2013.01); *H01J 37/32642* (2013.01); *H01J 2237/2007* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 6,108,189 A | * | 8/2000 | Weldon | C23C 16/4586 279/128 |
| 6,581,275 B2 | * | 6/2003 | Narendrnath | H01L 21/6831 29/842 |
| 2007/0283891 A1 | * | 12/2007 | Okayama | H01L 21/6831 118/728 |
| 2010/0193130 A1 | * | 8/2010 | Kawakami | H01L 21/6831 156/345.37 |
| 2010/0326602 A1 | * | 12/2010 | Bluck | H01L 21/6831 118/500 |
| 2014/0202635 A1 | * | 7/2014 | Yamaguchi | H01L 21/6831 279/128 |
| 2015/0332942 A1 | * | 11/2015 | Peh | H01L 21/67248 165/61 |

(Continued)

FOREIGN PATENT DOCUMENTS

JP 2002-222799 8/2002
JP 2006-344766 12/2006
(Continued)

*Primary Examiner* — Jeffrie R Lund
*Assistant Examiner* — Tiffany Z Nuckols
(74) *Attorney, Agent, or Firm* — IPUSA, PLLC

(57) ABSTRACT

A stage including a mounting section and an adhesive layer is provided. The mounting section is disposed in a plasma space, and a substrate is placed on the mounting section. The adhesive layer bonds the mounting section to a base. A through-hole penetrating the mounting section, the base, and the adhesive layer is formed in the stage. The through-hole is configured to supply a heat transfer gas. The stage includes a sleeve member provided in the through-hole. On a portion of a surface of the sleeve member, multiple fine holes connecting the through-hole with the plasma space are formed, and the portion is positioned at a higher level than the adhesive layer.

16 Claims, 6 Drawing Sheets

(56) References Cited

U.S. PATENT DOCUMENTS

| | | | | |
|---|---|---|---|---|
| 2018/0025933 A1* | 1/2018 | Ishimura | ............. | H01L 21/6833 269/8 |
| 2019/0099977 A1* | 4/2019 | Parkhe | .................... | B32B 3/266 |
| 2019/0371578 A1* | 12/2019 | Larosa | ............. | H01L 21/68785 |
| 2020/0286769 A1* | 9/2020 | Shiraishi | ........... | H01L 21/67253 |
| 2020/0411355 A1* | 12/2020 | Noorbakhsh | ..... | H01L 21/68742 |

FOREIGN PATENT DOCUMENTS

| | | |
|---|---|---|
| JP | 2016-028448 | 2/2016 |
| JP | 2017-519373 | 7/2017 |
| WO | 2015/175339 | 11/2015 |
| WO | 2020/004478 | 1/2020 |

* cited by examiner

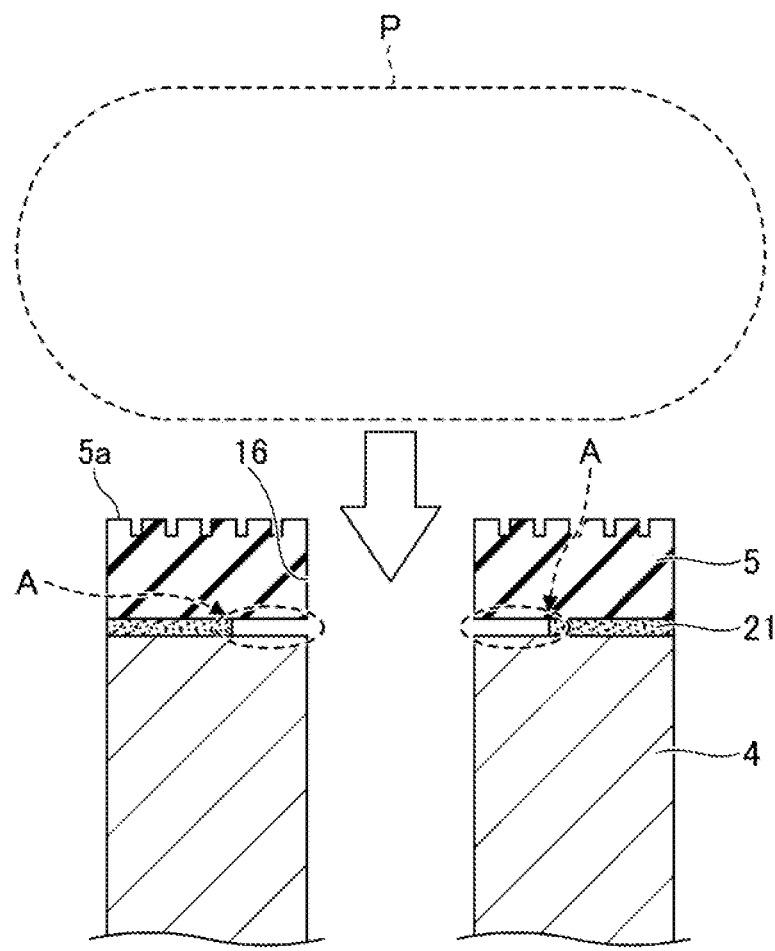

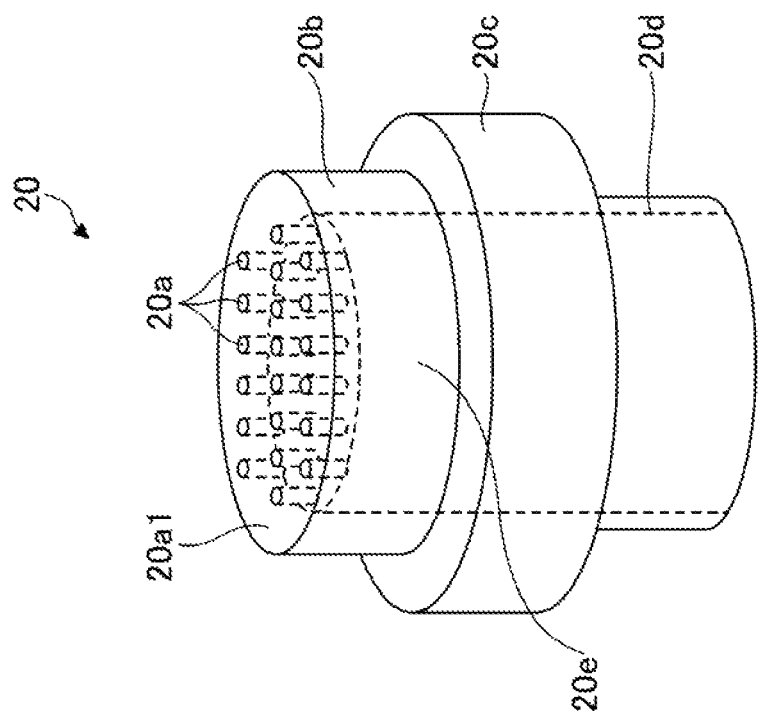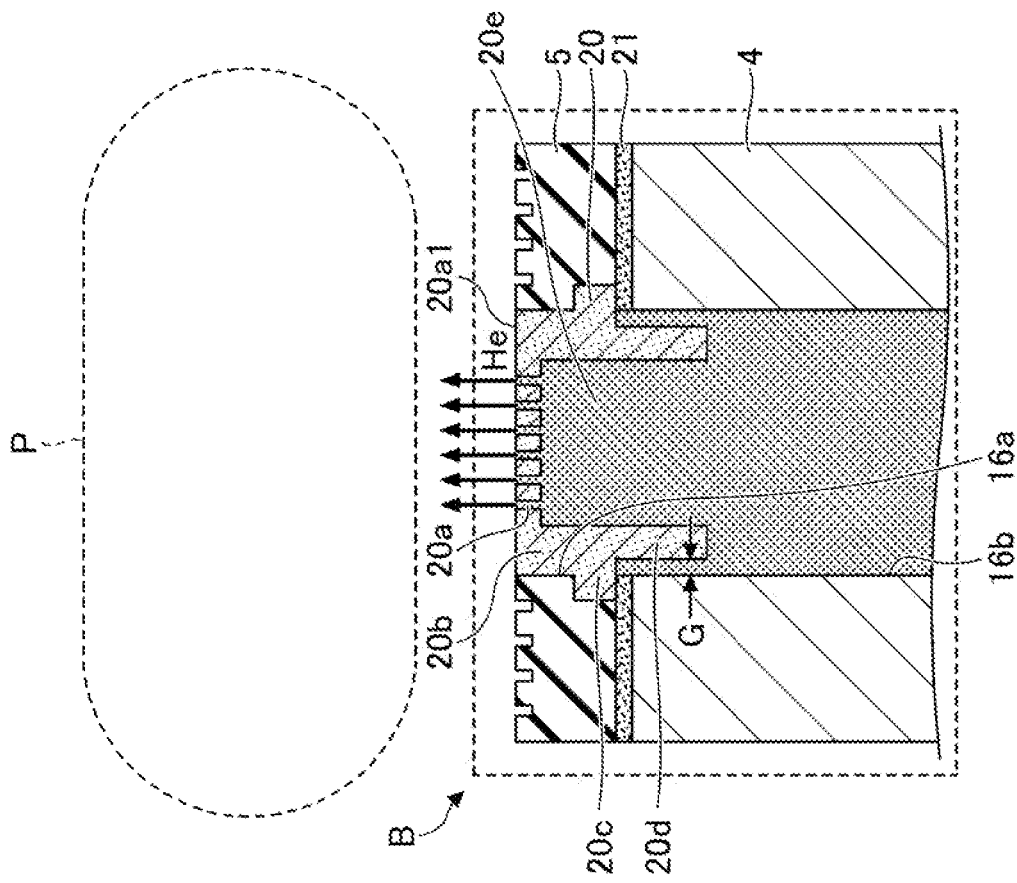

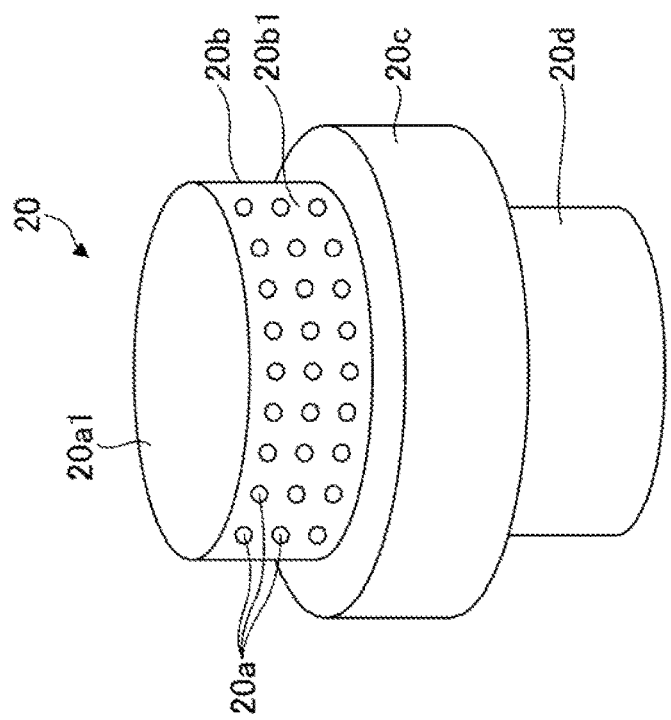
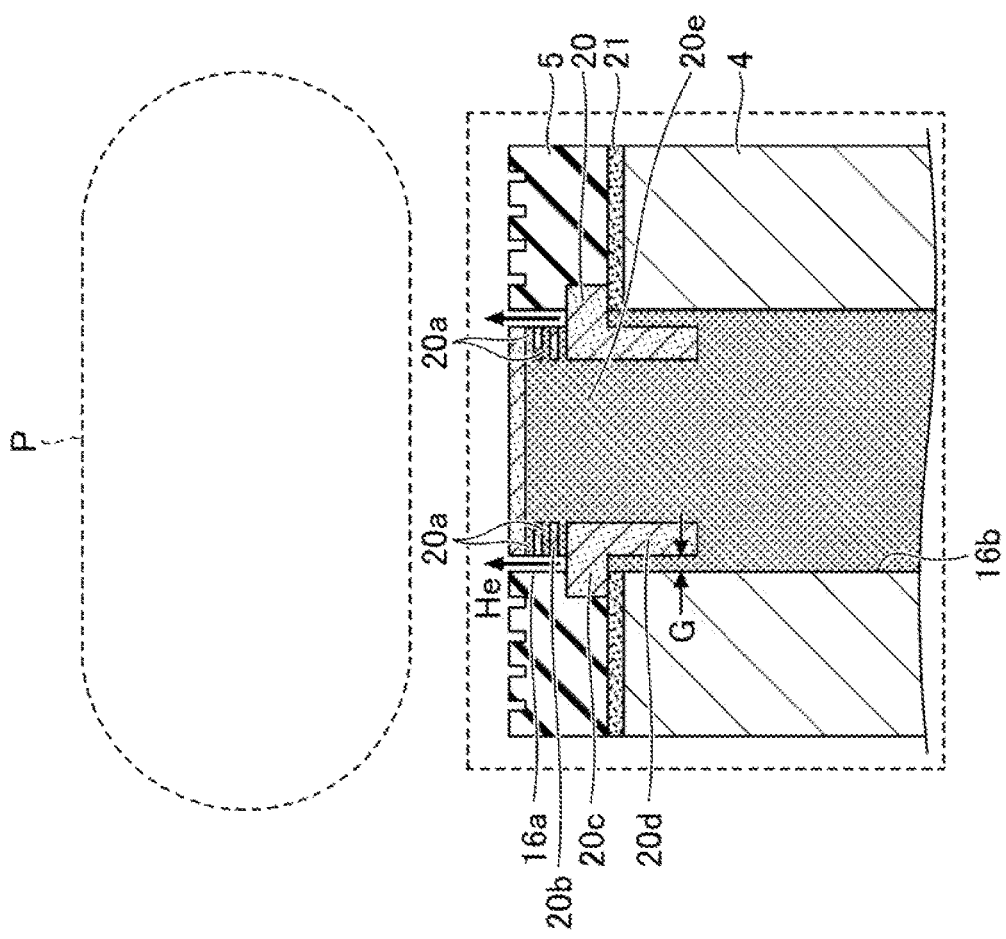

STAGE, PLASMA PROCESSING APPARATUS, AND CLEANING METHOD

CROSS-REFERENCE TO RELATED APPLICATIONS

This patent application is based upon and claims priority to Japanese Patent Application No. 2020-020840 filed on Feb. 10, 2020, the entire contents of which are incorporated herein by reference.

TECHNICAL FIELD

The present disclosure relates to a stage, a plasma processing apparatus, and a cleaning method.

BACKGROUND

Patent Document 1 describes a stage including an electrostatic chuck, a base, and a cylindrical sleeve. A first through-hole is formed in the electrostatic chuck. The base is bonded to the back surface of the electrostatic chuck by a first adhesive layer, and a second through-hole communicating with the first through-hole is formed in the base.

RELATED ART DOCUMENT

Patent Document

[Patent Document 1] Japanese Laid-open Patent Application Publication No. 2016-028448

SUMMARY

The present disclosure provides a stage, a plasma processing apparatus, and a cleaning method capable of preventing abnormal discharge while preventing abrasion of an adhesive.

According to one aspect of the present disclosure, a stage including a mounting section and an adhesive layer is provided. The mounting section is disposed in a plasma space, and a substrate is placed on the mounting section. The adhesive layer bonds the mounting section to a base. A through-hole penetrating the mounting section, the base, and the adhesive layer is formed in the stage. The through-hole is configured to supply a heat transfer gas. The stage includes a sleeve member provided in the through-hole. On a portion of a surface of the sleeve member, multiple fine holes connecting the through-hole with the plasma space are formed, and the portion is positioned at a higher level than the adhesive layer.

BRIEF DESCRIPTION OF THE DRAWINGS

FIG. 2 is a diagram illustrating entry of a plasma into through-holes of a stage according to a comparative example;

FIGS. 3A and 3B are views illustrating a sleeve member provided in a through-hole of the stage according to the embodiment;

FIGS. 4A and 4B are views illustrating a modified example of the sleeve member provided in the through-hole of the stage according to the embodiment;

DETAILED DESCRIPTION OF EMBODIMENTS

Figure 1:
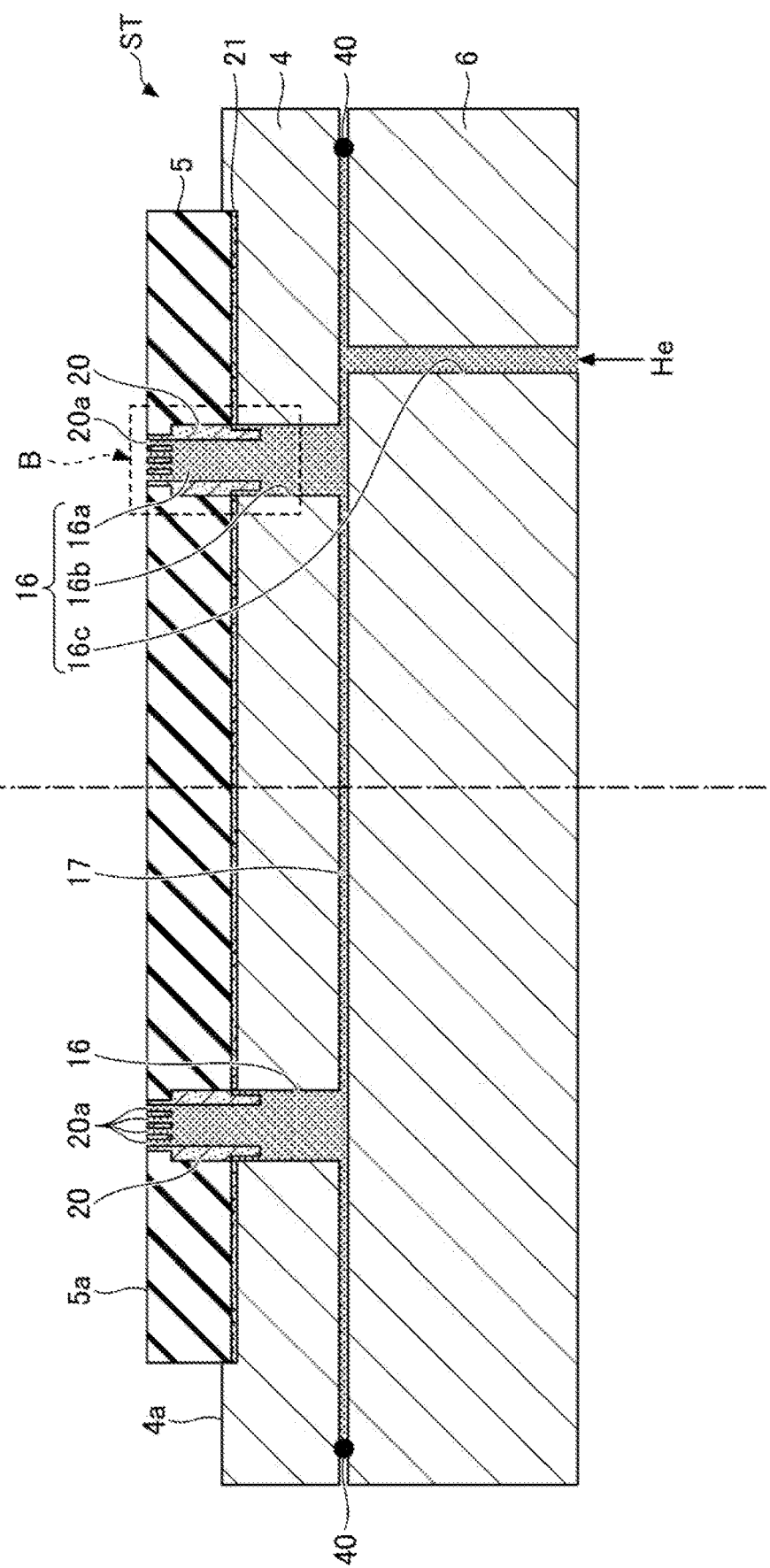
FIG. 1 is a schematic cross-sectional view illustrating a stage according to an embodiment.

Hereinafter, embodiments for carrying out the present disclosure will be described with reference to the drawings. Note that in the drawings, elements having substantially identical features are given the same reference symbols, and overlapping descriptions may be omitted.

[Stage]

FIG. 1 is a schematic cross-sectional view illustrating a stage ST mounted to a plasma processing apparatus according to an embodiment. The stage ST is formed in a hermetically constructed chamber, and a substrate, such as a wafer, is placed on the stage ST. The stage ST includes an electrostatic chuck 5, a first plate 4, and a second plate 6.

The first plate 4 and the second plate 6 are made of an electrically conductive material, such as aluminum. The electrostatic chuck 5 is made of a ceramic such as silicon carbide (SiC). The second plate 6 and the first plate 4 are bases that support the electrostatic chuck 5, and the substrate is placed on the electrostatic chuck 5. The electrostatic chuck 5 is an example of a mounting section disposed in a plasma space in the chamber, on which a substrate is placed. The first plate 4 and/or the second plate 6 are an example of a base supporting the mounting section. In the present embodiment, the first plate 4 and the second plate 6 are separate members. However, in another embodiment, a set of the first plate 4 and the second plate 6 is formed as an integrated member.

The electrostatic chuck 5, the first plate 4, and the second plate 6 are generally cylindrically formed around the central axis O. The diameter of the first plate 4 and the diameter of the second plate 6 are the same. The diameter of the electrostatic chuck 5 is smaller than the diameter of the first plate 4 and of the second plate 6. The upper surface of the electrostatic chuck 5 is a substrate mounting surface 5a on which a substrate is placed. The upper surface of the first plate 4 around the outer circumference of the electrostatic chuck 5 is an edge ring mounting surface 4a on which an edge ring is placed. An adhesive layer 21 is provided between the lower surface of the electrostatic chuck 5 and the upper surface of the first plate 4 to bond the electrostatic chuck 5 to the first plate 4.

In the stage ST, through-holes 16 and a common gas supply passage 17 for supplying heat transfer gas are formed. The common gas supply passage 17 is a space between the lower surface of the first plate 4 and the upper surface of the second plate 6. The common gas supply passage 17 is defined by an O-ring 40 provided near the end of the space between the lower surface of the first plate 4 and the upper surface of the second plate 6.

The through-hole 16 passes through the electrostatic chuck 5, the adhesive layer 21, and the first plate 4, communicates with the common gas supply passage 17, and further penetrates the second plate 6 below the common gas supply passage 17, to supply helium gas (He) as an example of a heat transfer gas. A portion of the through-hole 16 passing through the electrostatic chuck 5 in the vertical direction is referred to as a through-hole 16a, a portion of the through-hole 16 passing through the first plate 4 in the vertical direction is referred to as a through-hole 16b, and a portion of the through-hole 16 passing through the second plate 6 in the vertical direction is referred to as a through-hole 16c.

The through-hole 16b is located under the through-hole 16a, and communicates vertically with the through-hole 16a. The through-hole 16a opens to the substrate mounting surface 5a of the electrostatic chuck 5. The through-hole 16b communicates with the through-hole 16c via the common gas supply passage 17. In the present embodiment, the through-hole 16b and the through-hole 16c are displaced, and are not in vertical communication with each other. However, the through-hole 16c and the through-hole 16b may be configured such that the through-hole 16c is disposed under the through-hole 16b, to vertically communicate with each other. The diameter of each of the through-holes 16a, 16b, and 16c may be the same or different.

Helium gas passes through the through-hole 16c and the common gas supply passage 17, and passes through the through-hole 16b. Further, the helium gas is introduced from the through-hole 16a to a plasma space (processing space) above the substrate mounting surface 5a of the electrostatic chuck 5. At this time, the helium gas is not leaked to the side of the plasma space by the O-ring 40. The O-ring 40 has a function to separate the processing space, which is a vacuum space, from atmospheric space.

When substrates are processed in the chamber, a cleaning process is performed regularly or irregularly to maintain the condition in the chamber. As the cleaning process, waferless dry cleaning (hereinafter, referred to as "WLDC") is known in which a plasma of cleaning gas is generated without placing the substrate on the substrate mounting surface 5a, and reaction products adhering to the outer circumference of the electrostatic chuck 5 and adhering to other parts are removed.

FIG. 2 is a diagram illustrating intrusion of a plasma into the through-hole 16 for supplying a heat transfer gas provided in a stage according to a comparative example. When the WLDC is performed, because a substrate is not placed on the substrate mounting surface 5a, the plasma P in the plasma space enters the through-hole 16 as illustrated in FIG. 2. As a result, in particular, an adhesive of the adhesive layer 21, which fixes the electrostatic chuck 5 to the first plate 4, in the through-hole 16 is damaged. As the adhesive continues to be exposed to the plasma, the adhesive is eroded, as illustrated in regions A of FIG. 2. In the region where the adhesive is eroded, a space is generated between the electrostatic chuck 5 and the first plate 4, which inhibits heat transfer. As a result, controllability of a substrate temperature is deteriorated.

Accordingly, as illustrated in FIG. 1, in the stage ST according to the present embodiment, a sleeve member 20 having multiple fine holes 20a is pressed into or joined to the through-hole 16a, and helium gas is caused to flow from the through-hole 16a to the plasma space above the substrate mounting surface 5a. This prevents a plasma from entering the through-hole 16, and prevents the adhesive from eroding. Also, by machining the diameter of the fine hole 20a to 100 µm or less, abnormal discharge by the plasma can be prevented. In addition, conductance of helium gas injected into the plasma space from the fine holes 20a can be secured.

[Sleeve Member]

Next, a structure of the sleeve member 20 will be described with reference to FIGS. 3A and 3B, each of which enlarges the region B of FIG. 1. FIGS. 3A and 3B are diagrams illustrating the sleeve member 20 disposed in the through-hole 16 of the stage ST according to the present embodiment. FIG. 3A is a longitudinal cross-sectional view illustrating the sleeve member 20 disposed in the through-hole 16 of the stage ST according to the present embodiment. FIG. 3B is a perspective view of the sleeve member 20 according to the embodiment.

The sleeve member 20 is provided inside the through-hole 16 to occlude the opening of the through-hole 16, and the multiple fine holes 20a that connect the through-hole 16 with the plasma space are open to an upper surface 20a1 of the sleeve member 20. Within the through-holes 16a, the upper surface 20a1 is positioned at a higher level than the adhesive layer 21. As illustrated in FIG. 3B, the sleeve member 20 is a member in the shape of a cap, and the sleeve member 20 includes a space 20e and the multiple fine holes 20a in the sleeve member 20. The sleeve member 20 has a structure in which a middle portion protrudes, and includes a disc-shaped first portion 20b, an annular second portion 20c, and an annular third portion 20d from top to bottom. The space 20e in the first portion 20b communicates with the multiple fine holes 20a penetrating the upper surface 20a1 of the sleeve member 20, within the first portion 20b.

The sleeve member 20 may be formed of silicon carbide or a ceramic. In particular, because the upper surface 20a1 of the first portion 20b in which the fine holes 20a is formed is exposed directly to the plasma, it is preferable to use a plasma-resistant electrically conductive material, such as silicon carbide.

The diameter of the fine holes 20a may be, for example, within a range, inclusive of endpoints, from 50 µm to 100 µm. If the diameter of the fine holes 20a is equal to or less than 100 µm, the plasma can be prevented from entering the inside of the through-holes 16a according to Paschen's law.

In the present embodiment, the multiple fine holes 20a are formed in the vertical direction, which is the same direction as the direction in which the through-hole 16a is formed. This prevents the plasma from entering the through-hole 16a while securing conductance when helium gas is introduced into the plasma space, and prevents abnormal discharge from occurring at the through-hole 16a. This prevents the plasma from eroding the adhesive in the adhesive layer 21, and also prevents abnormal discharge from damaging the sleeve member 20 and surrounding structures. Thus, performance of the sleeve member 20 and the surrounding structures such as the electrostatic chuck 5 can be maintained, and life of the sleeve member 20 and the surrounding structures can be prolonged.

In particular, radio frequency current is applied to the stage ST from a radio frequency power supply. The radio frequency current flows from the first plate 4 formed of a conductive member to the chamber of the ground potential, through the plasma P. At this time, by providing the sleeve member 20 in the through-hole 16 through which helium gas flows, the clearance can be increased due to the multiple fine holes 20a of the sleeve member 20.

Further, the plasma space in which helium gas is introduced from the multiple fine holes 20a is a vacuum space. That is, helium gas is introduced into the vacuum space. When helium gas flows from a space with high pressure to a space with low pressure, abnormal discharge is likely to occur in the space with high pressure. In the stage ST according to the present embodiment, the fine holes 20a of the sleeve member 20 are provided at an entry portion of helium gas in which abnormal discharge is likely to occur, and the fine holes 20a become a flow passage through which helium gas flows. As the distance in which helium gas flows increases, acceleration force due to the electric field is reduced, and occurrence of abnormal discharge can be prevented.

Also, by causing helium gas to flow from the multiple fine holes 20a into the plasma space, the inside of the fine holes 20a can be made more pressurized than the plasma space. This can suppress entry of a plasma from the fine holes 20a into the interior of the through-holes 16a more effectively, thereby preventing the adhesive of the adhesive layer 21 from eroding more effectively.

The diameter of the second portion 20c is greater than the diameters of the first portion 20b, the third portion 20d, and the through-hole 16b. The inside of the through-hole 16a is provided with a portion whose diameter is extended by a difference between the diameter of the first portion 20b and the diameter of the second portion 20c. This allows the sleeve member 20 to be positioned, as the second portion 20c is fixed to a position corresponding to the upper surface of the through-hole 16b when the sleeve member 20 is pressed or joined into the inside of the through-hole 16a.

The diameter of the third portion 20d is smaller than the diameter of the through-hole 16b by the width of the gap G illustrated in FIG. 3A. Therefore, when the thermal expansion is caused by an input of plasma heat, it is possible to prevent friction between the sleeve member 20 and the first plate 4 caused by the difference in thermal expansion between the sleeve member 20 and the first plate 4, more specifically, due to the difference in the coefficient of linear thermal expansion between the sleeve member 20 and the first plate 4 that occurs because of the difference in material. Further, as the third portion 20d is disposed in the through-hole 16b, the adhesive layer 21 cannot be seen when seen from the plasma space. Accordingly, it is possible to more effectively prevent erosion of the adhesive in the adhesive layer 21.

The substrate mounting surface 5a of the electrostatic chuck 5 is provided with dot-shaped irregularities. The upper surface 20a1 of the sleeve member 20 is preferably positioned at any height from the bottom of the dot-shaped irregularities to the upper end of the irregularities. However, the substrate mounting surface 5a may be planar without having dot-shaped irregularities. In this case, it is preferable that the upper surface 20a1 of the sleeve member 20 is positioned at a height approximately the same as the substrate mounting surface 5a. This effectively suppresses plasma electric field concentration and prevents the occurrence of abnormal discharge.

[Variation]

Next, the sleeve member 20 according to a modified example will be described with reference to FIGS. 4A and 4B. FIGS. 4A and 4B are diagrams illustrating a modified example of the sleeve member 20 provided in the through-hole 16. FIG. 4A is a longitudinal cross-sectional view of the sleeve member 20 according to the modified example and of its periphery. FIG. 4B is a perspective view of the sleeve member 20 according to the modified example.

The sleeve member 20 according to the modified example is substantially the same as the sleeve member 20 according to the embodiment illustrated in FIGS. 3A and 3B. The difference is that the fine holes 20a in the sleeve member 20 are formed horizontally in the modified example. Accordingly, the fine holes 20a of the sleeve member 20 will be described below, and descriptions of other configurations of the sleeve member 20 will be omitted.

The multiple fine holes 20a according to the embodiment are formed perpendicular to the upper surface of the sleeve member 20. In contrast, multiple fine holes 20a according to the modified example extend horizontally through the first portion 20b and open to a side surface 20b1 of the first portion 20b, as illustrated in FIGS. 4A and 4B. Similar to the above-described embodiment, the sleeve member 20 in the modified example is disposed in the through-holes 16a such that the side surface 20b1 is positioned at a higher level than the adhesive layer. Then, there is a space in communication with the plasma space between the side surface 20b1 of the sleeve member 20 in which the multiple fine holes 20a open and the opposing surface of the electrostatic chuck 5.

In the stage ST according to the modified example, the sleeve member 20 is disposed at the opening of the through-hole 16a in which abnormal discharge occurs easily. Further, in the stage ST according to the modified example, by providing multiple fine holes 20a in the horizontal direction, the distance of a space having a potential difference increases, and in addition, a flow of helium gas flowing through the through-holes 16a and 16b in the vertical direction is bent in the horizontal direction when the helium gas passes through the multiple fine holes 20a. As a result, the linear distance in the flow passage of helium gas, in which electrons travel, is shortened. That is, because a space for accelerating electrons decreases, abnormal discharge can be suppressed. In addition, the opening of the fine holes 20a is hidden from the plasma space. Therefore, it is possible to further avoid electric field concentration by the plasma and further suppress abnormal discharge.

However, arrangement of the multiple fine holes 20a is not limited to the above-described arrangement, in which the multiple fine holes 20a are formed horizontally. The multiple fine holes 20a may be obliquely formed in the first portion 20b. In such an arrangement, the straight driving distance of the electrons in the flow path of the helium gas is shortened, and the abnormal discharge can be further suppressed.

Similar to the sleeve member 20 according to the embodiment illustrated in FIGS. 3A and 3B, by providing the multiple fine holes 20a in the sleeve member 20 according to the modified example, entry of a plasma can be prevented and abnormal discharge can be prevented, while securing conductance when helium gas is supplied to the plasma space. This prevents the adhesive of the adhesive layer 21 from being eroded by the plasma, prevents the abnormal discharge from damaging the sleeve member 20 and surrounding structures, and maintains and prolongs performance of the sleeve member 20 and the like.

[Plasma Processing Apparatus]

Figure 5:
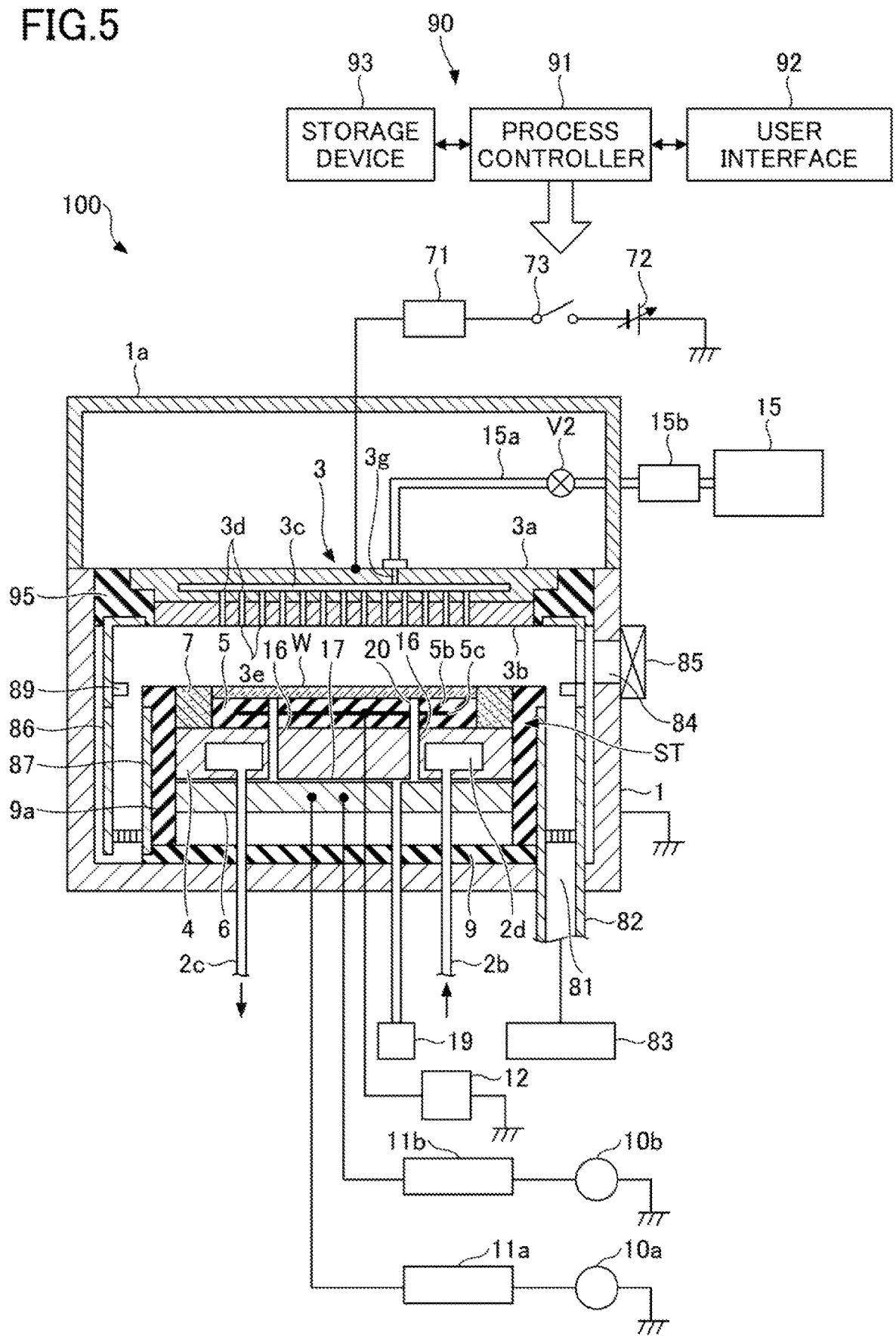
FIG. 5 is a schematic cross-sectional view illustrating a plasma processing apparatus according to the embodiment.

Next, an example of a plasma processing apparatus 100 having the stage ST according to the present embodiment or the stage ST according to the modified example will be described with reference to FIG. 5. FIG. 5 is a schematic cross-sectional view illustrating the plasma processing apparatus 100 according to the present embodiment.

The plasma processing apparatus 100 includes a chamber 1 configured to be hermetic and electrically grounded. The chamber 1 is cylindrical, and is made of, for example, aluminum. The stage ST is provided in the chamber 1 on which a substrate W is placed. The stage ST may be a stage ST according to the embodiment illustrated in FIGS. 3A and 3B, or a stage ST according to the modified example illustrated in FIGS. 4A and 4B.

An edge ring 7, which is formed, for example, of silicon, is provided at the periphery of the substrate W. The edge ring 7 may also be referred to as a focus ring. Around the edge ring 7, the first plate 4, and the second plate 6, a cylindrical inner wall member 9a made of, for example, quartz is provided. The stage ST is disposed at the bottom of the chamber 1 via the inner wall member 9a and a support member 9 connected to the lower end of the inner wall member 9a. The support member 9 is formed of, for example, quartz.

An electrode 5c in the electrostatic chuck 5 is embedded within a dielectric member 5b, and is connected to a power supply 12. When voltage is applied from the power supply 12 to the electrode 5c, the substrate W is electrostatically attracted to the electrostatic chuck 5 by Coulomb force.

The first plate 4 has a flow passage 2d therein. A heat exchange medium supplied from the chiller unit, e.g., water, circulates through an inlet pipe 2b, the flow passage 2d, and an outlet pipe 2c. The through-holes 16 and the common gas supply passage 17 are formed within the stage ST. A heat transfer gas supply 19 supplies a heat transfer gas to the through-hole 16 and the common gas supply passage 17, to introduce the heat transfer gas into a space between the lower surface of the substrate W and the substrate mounting surface 5a of the electrostatic chuck 5. In the present embodiment and its modified example, an example of introducing helium gas has been described. However, the heat transfer gas introduced is not limited to helium gas, but may be an inert gas such as argon gas (Ar). In addition to a heat transfer gas, a gas used for a process may be applied. Examples of the gas used in the process include oxygen gas ($O_2$) and nitrogen gas ($N_2$).

Multiple lift pins, e.g., three lift pins, penetrate the stage ST. Pin passages are provided in the stage ST, and the lift pins are inserted into the pin passages. The lift pins moves up and down by a lift mechanism.

A first radio frequency power supply 10a is connected to the second plate 6 via a first matching device 11a, and a second radio frequency power supply 10b is connected to the second plate 6 via a second matching device 11b. The first radio frequency power supply 10a applies radio frequency power of a first frequency for plasma generation to the second plate 6. The second radio frequency power supply 10b applies radio frequency power for bias voltage to the second plate 6, to draw ions. The radio frequency power for bias voltage has a second frequency different from the first frequency. However, the radio frequency power supplied from the second radio frequency power supply 10b may be used for plasma generation. An upper electrode 3 facing the stage ST is provided above the stage ST. The upper electrode 3 also functions as a gas showerhead.

The upper electrode 3 includes an electrode plate 3b and a top plate 3a. An insulating annular member 95 is provided around the upper electrode 3 to support the upper electrode 3, and the upper opening of the chamber 1 is occluded by the upper electrode 3 and the annular member 95. The top plate 3a is made of an electrically conductive material, for example, aluminum with an anodized surface, and the electrode plate 3b is detachably supported at the bottom of the top plate 3a.

In the top plate 3a, a gas diffusion chamber 3c and a gas inlet 3g for introducing a process gas into the gas diffusion chamber 3c are formed. A gas supply line 15a is connected to the gas inlet 3g. A gas supply section 15, a mass flow controller (MFC) 15b, and an open/close valve V2 are sequentially connected to the gas supply line 15a, and a process gas is supplied from the gas supply section 15 to the upper electrode 3 via the gas supply line 15a. The open/close valve V2 is used for on/off control of a gas, and the mass flow controller (MFC) 15b controls a flow rate of the gas.

A large number of gas holes 3d are formed at the bottom of the gas diffusion chamber 3c toward the chamber 1, to communicate with gas introduction holes 3e in the electrode plate 3b. A process gas passes through the gas diffusion chamber 3c and the gas holes 3d, and is supplied from the gas introduction holes 3e into the chamber 1 like a shower.

A variable direct-current (DC) power supply 72 is connected to the upper electrode 3 via a low pass filter (LPF) 71, and supply of DC voltage output from the variable DC power supply 72 is turned on and off by a switch 73. The DC voltage supplied from the variable DC power supply 72 and the on/off control of the switch 73 are controlled by a controller 90. When the radio frequency power is applied from each of the first radio frequency power supply 10a and the second radio frequency power supply 10b to the stage ST, to form a process gas into a plasma, the switch 73 is turned on if necessary by the controller 90, and desired DC voltage is applied to the upper electrode 3.

A cylindrical grounding conductor 1a is provided so as to extend above the height of the upper electrode 3 from the side wall of the chamber 1. The cylindrical grounding conductor 1a has a top wall on top thereof.

An exhaust port 81 is formed at the bottom of the chamber 1, and an exhaust device 83 is connected to the exhaust port 81 via an exhaust pipe 82. The exhaust device 83 includes a vacuum pump, and depressurizes the chamber 1 to a predetermined vacuum level by actuating the vacuum pump. At the side wall of the chamber 1, a loading/unloading port 84 for a substrate W is provided. The loading/unloading port 84 can be opened and closed by a gate valve 85.

A deposition shield 86 is provided at the inner side of the chamber 1 along the inner wall surface. Also, a deposition shield 87 is removably provided along the inner wall member 9a. The deposition shields 86 and 87 prevent etching by-products from adhering to the inner wall of the chamber 1 and to the inner wall member 9a. At a location of the deposition shield 86 substantially the same height as the substrate W, a conductive member (GND block) 89 that is grounded is provided, to prevent abnormal discharge.

The plasma processing apparatus 100 is collectively controlled by the controller 90. The controller 90 includes a process controller 91 that controls each part of the plasma processing apparatus 100, a user interface 92, and a storage device 93.

The user interface 92 includes a keyboard used by a process administrator to perform command input operations for managing the plasma processing apparatus 100, and a display or the like for visualizing (i.e., displaying) an operation status of the plasma processing apparatus 100.

The storage device 93 stores a control program (software) that causes, when executed by the process controller 91, the process controller 91 to control various processes executed by the plasma processing apparatus 100, and a recipe in which process condition data and the like is recorded. By loading a desired recipe from the storage device 93 in accordance with an instruction or the like from the user interface 92 and by causing the process controller 91 to execute the recipe loaded from the storage device 93, desired processing is performed by the plasma processing apparatus 100 under control of the process controller 91. The process controller 91 may use the control program and the recipe of processing condition data or the like that are stored in a computer-readable recording medium, or may use the control program and the recipe online by downloading the control program and the recipe from another device via a dedicated line, for example, as needed. Examples of the computer-readable recording medium include a hard disk, a compact disc (CD), a flexible disk, and a semiconductor memory.

[Cleaning Method]

Figure 6:
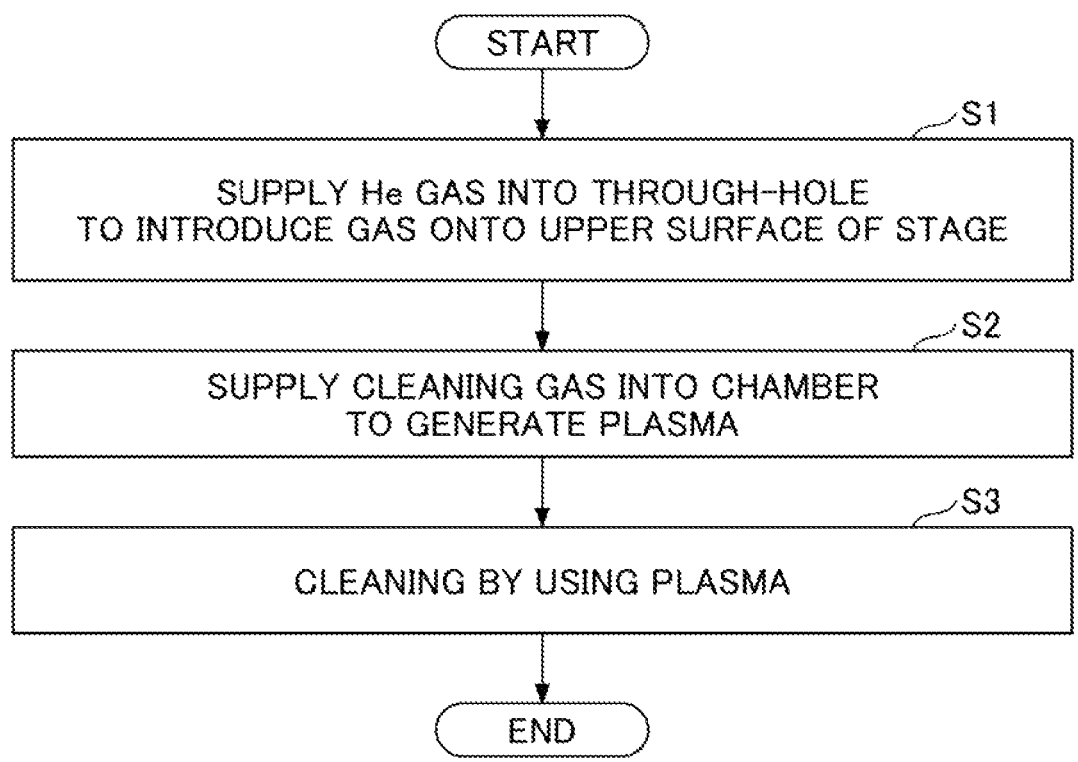
FIG. 6 is a flowchart illustrating a cleaning method according to the embodiment.

Finally, a cleaning process (i.e., cleaning method) performed by the plasma processing apparatus 100 having the stage ST according to the present embodiment or the stage ST according to the modified example will be described with reference to FIG. 6. FIG. 6 is a flowchart illustrating the cleaning method according to the present embodiment. The cleaning method according to the present embodiment is executed by the plasma processing apparatus 100, by the controller 90 controlling the plasma processing apparatus 100.

When the process of FIG. 6 is started, helium gas is supplied from the heat transfer gas supply 19 to the through-holes 16, and the helium gas is introduced into the plasma space from the multiple fine holes 20a (step S1). Subsequently, the cleaning gas is supplied into the chamber 1 to form the cleaning gas into a plasma, with radio frequency power of the first and/or second frequencies (step S2). Next, cleaning is performed by the plasma formed from the cleaning gas to remove reaction products adhering to the chamber 1 (step S3), and the process terminates.

The above-described cleaning method according to the present embodiment performs WLDC, in which cleaning is performed without placing a substrate on the substrate mounting surface 5a. In this case, the substrate mounting surface 5a is exposed to a plasma. However, by blowing helium gas through the multiple fine holes 20a in the sleeve member 20, the plasma formed from the cleaning gas can be prevented from entering the through-holes 16. Therefore, abnormal discharge can be prevented while preventing abrasion of the adhesive in the adhesive layer 21.

Although the stage, the plasma processing apparatus, and the cleaning method have been described in accordance with the above-described embodiment, the stage, the plasma processing apparatus, and the cleaning method according to the present invention are not limited to the above-described embodiment, and various modifications and enhancements can be made within the scope of the present invention. Matters described in the above-described embodiment and modified example can be combined to the extent that there is no conflict. For example, in the sleeve member 20 according to the above-described embodiment, multiple fine holes 20a are formed on the upper surface of the sleeve member 20, and in the sleeve member 20 according to the modified example described above, multiple fine holes 20a are formed on the side surface. However, the multiple fine holes may be formed on both the upper surface of the sleeve member and the side surface of the sleeve member.

For example, the stage according to the above-described embodiment and modified example include an electrostatic chuck, but the stage is not limited to the above-described configuration. For example, the stage is not required to include an electrostatic chuck. In this case, the mounting section of the stage does not have a function of an electrostatic chuck, and a substrate is placed on the upper surface of the mounting section.

The plasma processing apparatus according to the present invention is applicable to any of the following types of processing apparatuses: a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus. The cleaning method according to the present disclosure can be performed in any plasma processing apparatus including a chamber having a plasma space, a stage disposed within the plasma space, and a plasma generator configured to form a plasma from gas supplied into the plasma space.

What is claimed is:

1. A stage comprising:
   a base disposed in a plasma processing space;
   a mounting section having an upper surface on which a substrate is placed, the mounting section being disposed on the base;
   an adhesive layer bonding the mounting section to the base;
   a through-hole penetrating the mounting section, the base, and the adhesive layer, the through-hole being configured to supply a heat transfer gas; and
   a sleeve member provided in the through-hole; wherein
   the sleeve member includes a first portion, a second portion, and a third portion, the first portion being disc-shaped and having a thickness less than a thickness of the mounting section, the second portion being formed below the first portion and having a diameter greater than a diameter of the first portion, the third portion being formed below the second portion and having a diameter less than the diameter of the second portion, the second portion and the third portion being annular, and the first portion, the second portion, and the third portion being formed from a single piece of material,
   the first portion and the second portion are positioned at a higher level than the adhesive layer,
   a fine hole is formed in the first portion, a lower surface of the first portion being recessed to form an inner space, and the fine hole communicating with the inner space,
   the third portion does not contact the adhesive layer and the third portion does not contact the base,
   the third portion extends below the adhesive layer,
   the inner space formed in the first portion extends through the second portion and the third portion, and
   a diameter of the inner space in the first portion is equal to a diameter of the inner space in the second portion and is equal to a diameter of the inner space in the third portion.

2. The stage according to claim 1, wherein the fine hole is formed at an upper surface of the first portion, a side surface of the first portion, or both the upper surface and the side surface of the first portion.

3. The stage according to claim 2, wherein the upper surface of the first portion is positioned at a same height of the upper surface of the mounting section, or at a height between a bottom portion of dot-shaped irregularities formed on the upper surface of the mounting section and a top end of the dot-shaped irregularities.

4. The stage according to claim 2, wherein the fine hole is formed at the side surface of the first portion; and
   a space is formed between the side surface of the first portion and a surface of the mounting section facing the first portion.

5. The stage according to claim 1, wherein a space is formed between a side surface of the first portion and a side surface of the through-hole formed in the base.

6. The stage according to claim 1, wherein the sleeve member is formed of silicon carbide or a ceramic.

7. The stage according to claim 1, wherein the second portion is positioned on an upper surface of the adhesive layer.

8. The stage according to claim 1, wherein the fine hole is formed at a side surface of the first portion and a space is provided between the side surface of the first portion and a surface of the mounting section facing the first portion, the space communicating with the plasma processing space.

9. A plasma processing apparatus comprising:
a chamber;
a base disposed in a plasma processing space in the chamber;
a mounting section having an upper surface on which a substrate is placed, the mounting section being disposed on the base;
an adhesive layer bonding the mounting section to the base;
a through-hole penetrating the mounting section, the base, and the adhesive layer, the through-hole being configured to supply a heat transfer gas; and
a sleeve member provided in the through-hole, wherein
the sleeve member includes a first portion, a second portion, and a third portion, the first portion being disc-shaped and having a thickness less than a thickness of the mounting section, the second portion being formed below the first portion and having a diameter greater than a diameter of the first portion, the third portion being formed below the second portion and having a diameter less than the diameter of the second portion, and the second portion and the third portion being annular, and the first portion, the second portion, and the third portion being formed from a single piece of material,
the first portion and the second portion are positioned at a higher level than the adhesive layer,
a fine hole is formed in the first portion, a lower surface of the first portion being recessed to form an inner space, and the fine hole communicating with the inner space,
the third portion does not contact the adhesive layer and the third portion does not contact the base,
the third portion extends below the adhesive layer,
the inner space formed in the first portion extends through the second portion and the third portion, and
a diameter of the inner space in the first portion is equal to a diameter of the inner space in the second portion and is equal to a diameter of the inner space in the third portion.

10. The plasma processing apparatus according to claim 9, wherein the fine hole is formed at an upper surface of the first portion, a side surface of the first portion, or both the upper surface and the side surface of the first portion.

11. The plasma processing apparatus according to claim 10, wherein the upper surface of the first portion is positioned at a same height of the upper surface of the mounting section, or at a height between a bottom portion of dot-shaped irregularities formed on the upper surface of the mounting section and a top end of the dot-shaped irregularities.

12. The plasma processing apparatus according to claim 10, wherein the fine hole is formed at the side surface of the first portion; and
a first space is formed between the side surface of the first portion and a surface of the mounting section facing the first portion.

13. The plasma processing apparatus according to claim 9, wherein a second space is formed between a side surface of the first portion and a side surface of the through-hole formed in the base.

14. The plasma processing apparatus according to claim 9, wherein the sleeve member is formed of silicon carbide or a ceramic.

15. The plasma processing apparatus according to claim 9, wherein the second portion is positioned on an upper surface of the adhesive layer.

16. The plasma processing apparatus according to claim 9, wherein the fine hole is formed at a side surface of the first portion and a space is provided between the side surface of the first portion and a surface of the mounting section facing the first portion, the space communicating with the plasma processing space.

* * * * *